United States Patent [19]

Fukuda et al.

[11] Patent Number: 4,690,887
[45] Date of Patent: Sep. 1, 1987

[54] METHOD FOR FORMING MICRO-PATTERNS BY DEVELOPMENT

[75] Inventors: Mitsutoshi Fukuda, Tokuyama; Makoto Fukutomi, Shinnanyo; Osamu Kogure; Kazunori Miyoshi, both of Tokai, all of Japan

[73] Assignees: Nippon Telegraph and Telephone Corporation, Shinnanyo; Toyo Soda Manufacturing Co., Ltd., Tokyo, both of Japan

[21] Appl. No.: 800,100

[22] Filed: Nov. 22, 1985

Related U.S. Application Data

[63] Continuation of Ser. No. 489,344, Apr. 28, 1983, abandoned.

[30] Foreign Application Priority Data

Apr. 28, 1982 [JP] Japan ................... 57-70482

[51] Int. Cl.$^4$ ............................................. G03C 5/00
[52] U.S. Cl. .................... 430/331; 430/325; 252/170; 252/162
[58] Field of Search ............... 430/287, 296, 325, 331; 252/162, 170; 134/38

[56] References Cited

U.S. PATENT DOCUMENTS

| | | | |
|---|---|---|---|
| 3,634,082 | 1/1972 | Christensen | 430/326 X |
| 3,987,215 | 10/1976 | Cortellino | 430/296 |
| 4,141,733 | 2/1979 | Guild | 430/326 |
| 4,148,654 | 4/1979 | Oddi | 430/270 |
| 4,271,251 | 6/1981 | Aotani et al. | 430/195 |
| 4,299,911 | 11/1981 | Ochi et al. | 430/286 |
| 4,507,384 | 3/1985 | Morita et al. | 430/311 |
| 4,515,886 | 5/1985 | Yamaoka et al. | 430/270 |
| 4,564,579 | 1/1986 | Morita et al. | 430/270 |

OTHER PUBLICATIONS

Kirk–Othmer, *Encyclopedia of Chemical Technology*, 2nd Ed., vol. 8, 1965.

*Primary Examiner*—John E. Kittle
*Assistant Examiner*—José G. Dees
*Attorney, Agent, or Firm*—Oblon, Fisher, Spivak, McClelland & Maier

[57] ABSTRACT

Disclosed is a method for forming micro-patterns on base plates such as for semiconductor integrated circuits, particularly by development, wherein a radiation sensitive negative resist film is formed on the base plate and irradiated according to pattern designs, and the non-irradiated portions of the film is dissolved by a liquid developer comprising a mixture of a good solvent selected from the group of alkyl esters of acetic acid, having an alkyl group containing 1 to 5 carbon atoms, and a poor solvent selected from the group consisting of alicyclic compounds and alkyl ethers of ethyleneglycol having an alkyl group containing 1 to 5 carbon atoms. The method can minimize swelling of irradiated portions of the resist film and can accelerate dissolution of non-irradiated portions of the resist film, so that desired micro-patterns with excellent edge shape quality can be obtained.

1 Claim, No Drawings

METHOD FOR FORMING MICRO-PATTERNS BY DEVELOPMENT

This application is a continuation, of application Ser. No. 489,344, filed Apr. 28, 1983, now abandoned.

BACKGROUND OF THE INVENTION

1. Field of the Invention

The present invention relates to a method of microprocessing to be applied in the production of semiconductor integrated circuits utilizing a radiation sensitive negative resist, particularly to a method of forming patterns by the process of development.

2. Description of Prior Art

Conventionally, in the etching process for producing semiconductor integrated circuits, the most widely adopted practice has been the method of forming patterns by use of photo-sensitive resins (photo-resists) which are sensitive to visible and ultraviolet rays. In recent years, in order to meet with increasing demands for the higher integration of elements intended to improve the reliability and performance of circuits, intensive efforts have been made to establish the ultramicrotechnique for forming circuit patterns. Among them, methods of forming high precision circuit patterns have been developed utilizing high energy radiations such as far ultraviolet ray, X-ray and electron beams in substitution for the conventional light beam. In the production of integrated circuits, a resist is applied on a base plate to form a thin film, on which a micro-pattern is printed by exposure to radiation followed by development. Then etching, especially dry etching by means of plasma, is applied to process the part of the base plate where the pattern has not been formed. However, recent demands are such that circuit patterns as small as 1 micron, and further submicron patterns must be proceeded. To meet with these demands, a high resolution radiation resist with good dry etching resistance must be developed and, in addition, a method of processing the resist, particularly a method of developing the micro-patterns must be established. From the point of dry etching resistance more attention has been given to radiation sensitive resists, particularly negative resists, which are prepared from a polymer of aromatic vinyl compound as raw material.

When the radiation sensitive resist is exposed to radiation, the irradiated portion turns into gel and becomes insoluble in a solvent due to the crosslinking reaction between polymer chains. Thus, in the developing process, a pattern can be formed by dissolving the non-irradiated portions in the liquid developer. However, when a micropattern is formed using the negative resist, swelling of the irradiated portion, if any during the developing, causes lowering of the resolution. Therefore, it is especially important to select an appropriate solvent system for the developer, so as to minimize the swelling of the irradiated portions as well as to accelerate dissolution of the non-irradiated portions. Further, consisting of development and surface conditions of the resist after the developing should be considered in the selection of optimum developers from the aspect working process.

The present inventors have made extensive studies and investigations on the development process of negative resists made from aromatic vinyl polymers with the mentioned requirements in mind, and finally arrived at the completion of this invention.

SUMMARY OF THE INVENTION

The present invention provides a method of developing radiation sensitive resist prepared from an aromatic vinyl polymer, which comprises applying the resist on the surface of a base plate and irradiating it with radiation, and then developing a use for pattern by using a mixture of a good solvent selected from the group consisting of alkyl esters of acetic acid having an alkyl group containing 1 to 5 carbon atoms, and a poor solvent selected from the group consisting of alicyclic compounds and alkyl ethers of ethyleneglycol having an alkyl group containing 1 to 5 carbon atoms.

The object of this invention is to find a developing process which can be satisfactorily applied to a negative resist made from an aromatic vinyl polymer of high dry etching resistance and thereby to provide a method of forming micro-patterns down to the submicron region.

DETAILED DESCRIPTION OF THE INVENTION

The aromatic vinyl compound polymers to be used for the negative resist of this invention include single polymers such as styrene, vinyltoluene, halogenated styrenes, halomethylated styrenes, haloethylated styrenes and dialkylaminomethylated styrenes; and copolymers which contain at least one of the above-mentioned compounds.

As the sensitivity of resists depends on the molecular weight of the material, the molecular weight of the polymers should be not less than 5,000, preferably 10,000. On the other hand, since the resolving power of negative resists depends largely on the distribution of molecular weight, polymers of smaller molecular weight distribution are preferably employed.

For the selection of developers which are favourable to the negative resist prepared from aromatic vinyl polymers, investigations have been made on various single solvents and mixed solvents of good and poor solvents with respect to their dissolving property and the swelling of radiation crosslinked gels of the concerned polymers. The results have revealed that, when acetic esters are used as solvent, smaller swelling results with the crosslinked polymer gels than when other solvents, such as aromatic hydrocarbons, are used, and that micro-patterns having a good resolution property and an excellent edge shape quality of patterns can be produced by using a developer of a mixed solvent which is prepared by mixing an acetic ester with an alicyclic compound or with a lower alkyl ether of ethyleneglycol, the alkyl group having 1 to 5 carbon atoms.

The acetic esters to be used in the present invention are alkyl esters of acetic acid in which alkyl groups contain 1 to 5 carbon atoms. They include ethyl acetate, propyl acetate, isopropyl acetate, butyl acetate, isobutyl acetate, amyl acetate and isoamyl acetate.

These alicyclic compounds and lower alkyl ethers of ethyleneglycol constituting the mixed solvent system with the acetic esters are poor solvent, or substantially non-solvent, with respect to aromatic vinyl compound polymers. They include cyclohexane, methylcyclohexane, ethylcyclohexane, decaline; and ethyleneglycol methyl ether, ethyleneglycol ethyl ether and ethyleneglycol butyl ether.

According to the present invention, desired patterns can be made in the following way: a negative resist prepared from an aromatic vinyl compound polymer as raw material is applied on a base plate to form a uniform thin film, exposed to a radiation according to the designed data, and then treated with the developer composed of a mixture of good and poor solvents, either by soaking or spraying, etc. to produce the desired patterns.

To meet with the requirements in the course of the process, such as the stability of developers and to facilitate the spray development, a preferable selection of good and poor solvents will be such that the vapor pressure of both solvents is as close as possible to each other. Preferred combinations are; for instance, such as isopropyl acetate and cyclohexane; propyl acetate and methylcyclohexane; butyl acetate and ethyleneglycolmethyl ether; and isoamyl acetate and ethyleneglycolethyl ether.

The mixing ratio of good and poor solvents may be varied from 99/1 to 1/99, preferably from 95/5 to 5/95. Since the optimal ratio varies depending on the nature and the molecular weight of the aromatic vinyl compound polymer employed and, in case of copolymers, on the composition of polymers, the optimal ratio should be decided considering the necessary resolution of patterns involved.

DESCRIPTION OF PREFERRED EMBODIMENTS

The present invention will be better understood from the following description of some preferred embodiments.

EXAMPLE 1

Polystyrene of a small molecular weight distribution (weight average molecular weight is $1.06 \times 10^5$ and degree of distribution is 1.01) prepared by the living anion polymerization process was dissolved in chlorobenzene to make a 9% resist solution. This resist was filtered through a micro-filter of a 0.2 μm pore diameter, and applied with a spinner on rotating silicon wafers having a thermooxidized film on the surface to form a uniform thin resist film of 0.5 μm thickness, and the wafers were baked for 20 minutes in a nitrogen atmosphere at 100° C.

Subsequently, line patterns of different dimensions were drawn on wafers by electron rays of accelerating voltage 20 KV, with different irradiation amounts. The treated wafers were developed for 1 minute at 25° C., where the developing was conducted with mixtures of isoamyl acetate and ethyleneglycol ethylether with the following mixing ratio, 70/30, 60/40, 55/45, 50/50 and 45/55. The wafers were then washed for 30 seconds with isopropyl alcohol, dried and the patterns were observed with respect to their remaining film thickness and the shapes. If the sensitivity of resists is defined by $Dg^{0.5}$ expressing the amount of irradiation by electron beams at which the remaining thickness of film after the development becomes 50% of that initially applied, this value amounted to $6 \times 10^{-5}$ coulombs, almost independent of the ratio of mixing of the solvents. Microscopic observation of patterns showed the best resolution at the ratios of mixing 50/50 and 45/55, where a micropattern as small as 0.3 μm line/space could be formed.

EXAMPLE 2-5

Resists were prepared from four kinds of living polymerized polystyrenes of different molecular weights, and applied on base plates, and electron beam drawing and development of patterns in the same way as in Example 1. In these Examples, however, the concentration of the resist solution was adjusted so as to assure application of a 0.5 μm thick film. Estimations were made on the relation between the sensitivity of these resists and the optimal mixing ratio of isoamyl acetate and ethyleneglycol ethyl ether in the developing solution. Results of the estimations are summarized in the Table, together with the corresponding results in Example 1.

EXAMPLE 6

Chloromethylated polystyrene (chloromethylated to 51%) obtained by partial chloromethylation of polystyrene (weight average molecular weight $4.3 \times 10^4$ and degree of dispersion 1.01) prepared by the living polymerization process was dissolved in xylene and filtered to obtain a resist solution. This was applied with a spinner on rotating silicon wafers having an oxide film on their surface, to form a 0.68 μm thick film thereon. The wafers were baked at 120° C. in a nitrogen atmosphere for 25 minutes. A series of patterns of a constant line width (3 μm) and different space widths were drawn on their surfaces with electron beams of 20 KV accelerating voltage. Subsequently the wafers were soaked for 1 minute in 25° C. developers of mixed solvents of isopropyl acetate and cyclohexane in different mixing ratios, and then washed for 30 seconds with isopropyl alcohol, dried in a nitrogen stream to establish the patterns. $Dg^{0.5}$ was estimated to be $4 \times 10^{-6}$ coulombs/cm$^2$, and the development with a developer of a mixing ratio around 33/67 gave resolution of a pattern having a space width of 0.75 μm and the pattern was firmly set.

Spray development was conducted using a developer of the same solvent mixing ratio as above. The nitrogen pressure for delivering the liquid was 30 psi, the developing time was 1 hour and the washing time was 30 seconds. Resolution of the micro-pattern obtained was almost the same as that obtainable by the soaking process. The developing proceeded completely.

EXAMPLE 7.

The same polystyrene as used in Example 3 was chlorinated by an organic electrolytic reaction, to obtain chlorinated polystyrene. Content of chlorine per repeating styrene unit amounted to 0.68. Resolution of the final pattern as examined by the same method as in Example 1 was satisfactory. Micro-patterns in the submicron range could be formed using a developer made of a mixed solvents of propyl acetate and methylcyclohexane in the mixing ratio 15/85.

EXAMPLE 8 p-vinyltoluene polymer was prepared by the living polymerization method. Molecular weight was $1.2 \times 10^5$ and the degree of dispersion was 1.04. The application os resist, electron beam drawing and developing were performed by the same method as in Example 1, except that the base plate was a chromium mask blank having a chromium oxide surface. Patterns could be formed of a line width of 0.5 μm by using a liquid developer of a mixture of isoamyl acetate and ethyleneglycolethyl ether with a mixing ratio 50/50. On the other hand, the same treatment was applied to a p-vinyltoluene polymer (molecular weight about 150,000) of relatively large molecular weight distribution prepared by the ordinary radical polymerization. Almost the same mixing ratio of the mixed solvents as that used for the polymer prepared by the living polymerization gave the best developing effect, but the living polymerized polymer evidenced better resolution.

EXAMPLE 9

The same polystyrene as used in Example 1 was partially chloromethylated to obtain chloromethylated polystyrene of chloromethylation rate 16%. In the same manner as in Example 3, this was dissolved in xylene and applied on silicon wafers having an oxide film on the surface to form 0.7 μm thick thin films thereon, and then the surface was irradiated by far ultraviolet rays with an optical system consisting of a 500 W Xe-Hg lamp as light source and a 250 nm cold mirror. More particularly, masks on which patterns of different line/space dimensions are drawn were closely applied on the resist-coated surface of silicon wafers, and the surfaces were exposed to the far ultraviolet rays for 10 seconds, to transfer the patterns on the masks. Developing that followed with a mixed solvents of isoamyl acetate and ethyleneglycolethyl ether in the mixing ratio of 45/55 successfully gave micro-patterns of 0.75 μm line width/space.

TABLE

| | Molecular Weight ($\times 10^5$) | Sensitivity $D_g^{0.5}$ (Coulomb/cm$^2$) | Optimal Mixing Ratio (% in Volume of Good Solvent) |
|---|---|---|---|
| Example 1 | 1.06 | $6 \times 10^{-5}$ | around 45 |
| Example 2 | 0.43 | $2 \times 10^{-4}$ | around 30 |
| Example 3 | 4.22 | $1.8 \times 10^{-5}$ | around 50 |
| Example 4 | 7.75 | $7 \times 10^{-6}$ | around 55 |
| Example 5 | 28.8 | $2 \times 10^{-6}$ | around 60 |

What we claim:

1. A developer for developing patterns of a radiation sensitive negative resist prepared from a polymer of an aromatic vinyl compound comprising a mixture of a good solvent and a poor solvent, wherein the mixture of good and poor solvents is a mixture of isoamyl acetate and ethleneglycol ethylether in the ratios of about 50/50 and 45/55, respectively.

* * * * *